(12) United States Patent        (10) Patent No.:     US 12,388,441 B2
Tajima et al.                    (45) Date of Patent:     Aug. 12, 2025

(54) GATE DRIVING CIRCUIT

(71) Applicant: ROHM CO., LTD., Kyoto (JP)

(72) Inventors: Shinya Tajima, Kyoto (JP); Seiya Kitagawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 68 days.

(21) Appl. No.: 18/463,561

(22) Filed: Sep. 8, 2023

(65) Prior Publication Data

US 2023/0421151 A1    Dec. 28, 2023

Related U.S. Application Data

(63) Continuation of application No. PCT/JP2021/048788, filed on Dec. 28, 2021.

(30) Foreign Application Priority Data

Mar. 19, 2021    (JP) .................... 2021-045567

(51) Int. Cl.
H03K 17/567    (2006.01)
H03K 17/691    (2006.01)
H03K 19/0944   (2006.01)

(52) U.S. Cl.
CPC ......... H03K 17/567 (2013.01); H03K 17/691 (2013.01); H03K 19/09448 (2013.01)

(58) Field of Classification Search
CPC .................................................. H03K 17/567
USPC ..................................................... 327/108
See application file for complete search history.

(56) References Cited

U.S. PATENT DOCUMENTS

2005/0253165 A1    11/2005  Pace et al.
2018/0309437 A1*   10/2018  Yoshida ............... H03K 17/162

FOREIGN PATENT DOCUMENTS

CN    211579865          9/2020
CN    211579865  U   *   9/2020
JP    2012-257421        12/2012
WO    WO 2017/119090      7/2017

OTHER PUBLICATIONS

International Search Report and Written Opinion in International Appln. No. PCT/JP2021/048788, mailed on Mar. 8, 2022, 14 pages (with machine translation).

* cited by examiner

Primary Examiner — Tomi Skibinski
(74) Attorney, Agent, or Firm — Fish & Richardson P.C.

(57) ABSTRACT

A gate drive circuit (201) includes: a PNP transistor (Q1) having an emitter connected to a gate of a driven transistor (Q) and a collector connected to a ground application terminal; a capacitor (C1) having a first end connected to a base of the PNP transistor and a second end connected to the ground application terminal; a base-emitter resistor (R1) having a first end connected to the emitter of the PNP transistor and a second end connected to the base of the PNP transistor; an electric charge supplying portion (201A); an electric charge extracting portion (201B); a charging portion (201C); and a discharging portion (201D).

15 Claims, 12 Drawing Sheets

GATE DRIVING CIRCUIT

CROSS-REFERENCE TO RELATED APPLICATIONS

This nonprovisional application is a continuation application of International Patent Application No. PCT/JP2021/048788 filed on Dec. 28, 2021, which claims priority Japanese Patent Application No. 2021-045567 filed on Mar. 19, 2021, the entire contents of which are hereby incorporated by reference.

TECHNICAL FIELD

The present disclosure relates to gate driving circuits.

BACKGROUND ART

Some known gate driving circuits for driving the gate of a driving target transistor have a mirror clamp function (e.g., Patent Document 1 identified below). The mirror clamp function requires a mirror clamp transistor that is connected to the gate of the driving target transistor. When the driving target transistor off, turning on the mirror clamp transistor permits electric charge to be extracted from the gate of the driving target transistor via the mirror clamp transistor. In this way it is possible to prevent the driving target transistor from being turned on erroneously due to a rise in the gate voltage of the driving target transistor (a phenomenon called erroneous turning-on).

CITATION LIST

Patent Literature

Patent Document 1: JP-A-2012-257421

DESCRIPTION OF EMBODIMENTS

Hereinafter, illustrative embodiments of the present disclosure will be described with reference to the accompanying drawings.

INDUSTRIAL APPLICABILITY

1. Transistor Driving System

Figure 1:
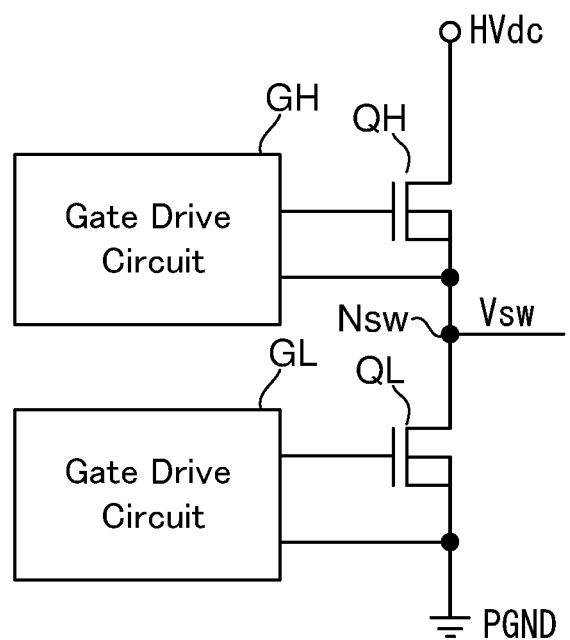
FIG. 1 is a diagram showing one example of a transistor driving system.

FIG. 1 is a diagram showing one example of a transistor driving system. The transistor driving system 100 shown in FIG. 1 includes a high-side transistor QH and a low-side transistor QL, each as a driving target transistor, as well as a high-side gate driving circuit GH and a low-side gate driving circuit GL. The high-side gate driving circuit GH drives the gate of the high-side transistor QH, and the low-side gate driving circuit GL drives the gate of the low-side transistor QL.

The high-side and low-side transistors QH and QL are each configured as an NMOS transistor. The drain of the high-side transistor QH is connected to an application terminal for a supply voltage HVdc. The supply voltage HVdc is a DC (direct-current) voltage. The source of the high-side transistor QH is connected to the drain of the low-side transistor QL at a node Nsw. The source of the low-side transistor QL is connected to an application terminal for a ground potential PGND. The reference for the supply voltage HVdc is the ground potential PGND.

The high-side and low-side transistors QH and QL are each a MOSFET (metal-oxide-semiconductor field-effect transistor) that uses SiC, GaN, Si, or the like as a semiconductor material. The high-side and low-side transistors QH and QL may instead be each an IGBT (insulated-gate bipolar transistor).

The high-side and low-side gate driving circuits GH and GL respectively switch the high-side and low-side transistors QH and QL complementarily, so that a switching voltage Vsw appears at the node Nsw.

The configuration of the high-side and low-side gate driving circuits GH and GL will be described later.

2. Comparative Example

Figure 2:
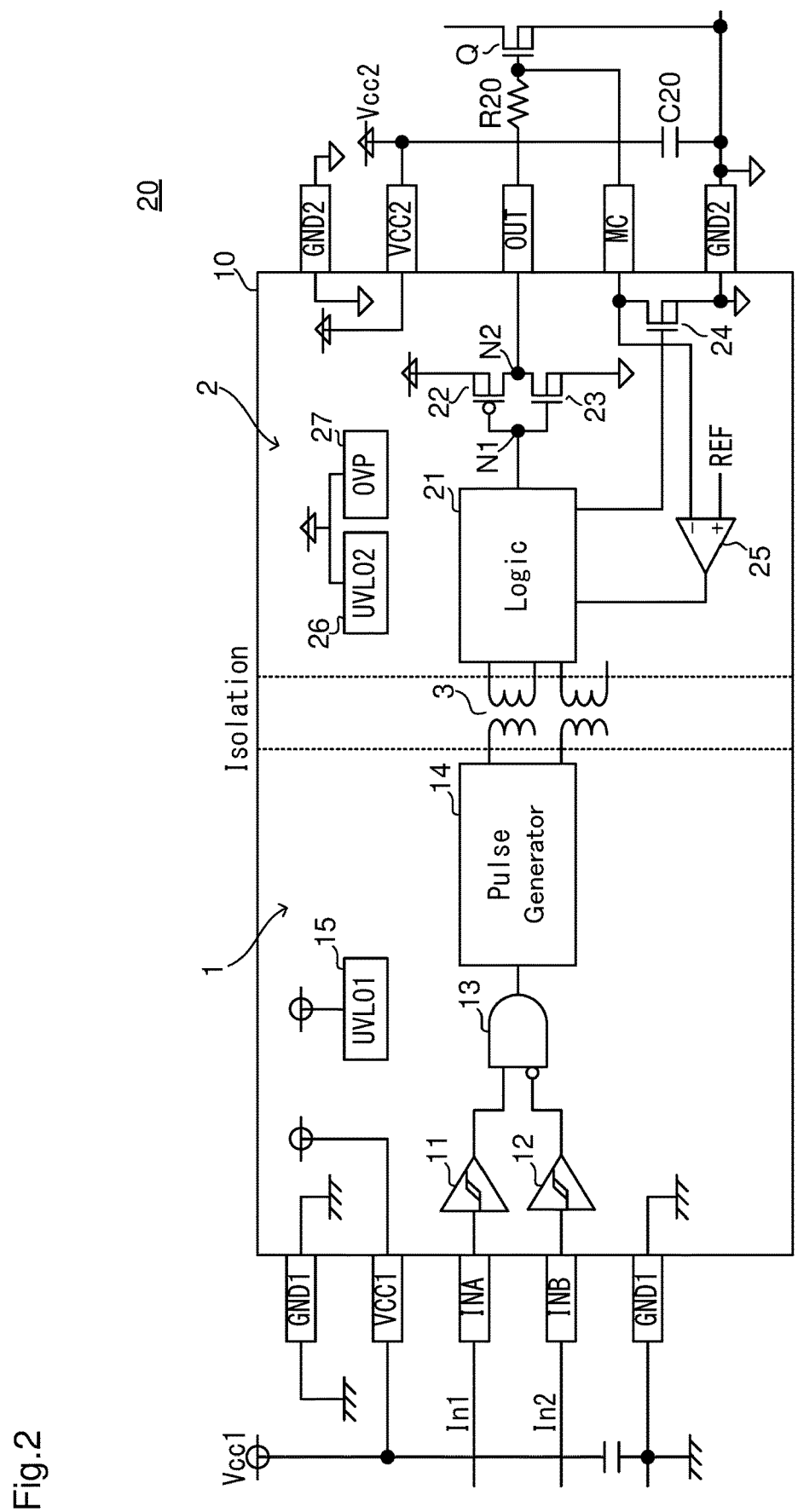
FIG. 2 is a diagram showing a configuration of a gate driving circuit of a comparative example.

Prior to a description of embodiments of the present disclosure, a comparative example for comparison with the embodiments of the present disclosure will be described. FIG. 2 is a diagram showing the configuration of a gate driving circuit 20 of the comparative example. As shown in FIG. 2, the gate driving circuit 20 is a circuit for driving the gate of an NMOS transistor Q.

The NMOS transistor Q is a driving target transistor, and corresponds to either of the high-side and low-side transistors QH and QL shown in FIG. 1 referred to previously. Accordingly, the gate driving circuit 20 corresponds to either of the high-side and low-side gate driving circuits GH and GL. Thus, the high-side and low-side gate driving circuits GH and GL can each have a configuration similar to that shown in FIG. 2.

The gate driving circuit 20 includes a gate driver 10, a resistor R20, and a capacitor C20. The gate driver 10 is an IC package (semiconductor package) that has the internal configuration shown in in FIG. 2 integrated into it. The resistor R20 and the capacitor C20 are discrete components that are externally connected to the gate driver 10.

The gate driver 10 has a primary circuit 1, a secondary circuit 2, and an isolation transformer 3. The gate driver 10 also has external terminals (lead terminals) for establishing electrical connection with the outside, namely a GND1 terminal, a VCC1 terminal, an INA terminal, an INB terminal, a GND2 terminal, a VCC2 terminal, an OUT terminal, and an MC terminal.

The primary circuit 1 includes a first Schmitt trigger 11, a second Schmitt trigger 12, an AND circuit 13, a pulse generator 14, and a first UVLO (undervoltage lock-out) circuit 15.

The secondary circuit 2 includes a logic circuit 21, a PMOS transistor 22, an NMOS transistor 23, a mirror clamp MOS transistor 24, a comparator 25, a second UVLO circuit 26, and an OVP (overvoltage protection) circuit 27.

The isolation transformer 3 is connected so as to couple together the primary and secondary circuits 1 and 2. The isolation transformer 3, while isolating the primary and secondary circuits 1 and 2 from each other, transmits a signal from the primary circuit 1 to the secondary circuit 2.

The first UVLO circuit 15 monitors a supply voltage Vcc1, which is applied to the VCC1 terminal. When the supply voltage Vcc1 becomes lower than a predetermined voltage, the first UVLO circuit 15 shuts down the primary circuit 1.

The first Schmitt trigger 11 transmits a first input signal In1, which is externally fed in via the INA terminal, to the first input terminal of the AND circuit 13. The second Schmitt trigger 12 transmits a second input signal In2, which is externally fed in via the INB terminal, to the second input terminal of the AND circuit 13.

The AND circuit 13 outputs the AND of the signal level it receives at the first input terminal and the level resulting from inverting the signal level it receives at the second input terminal. Accordingly, when the first input signal In1 is at low level and the second input signal In2 is at low level, or when the first input signal In1 is at low level and the second input signal In2 is at high level, or when the first input signal In1 is at high level and the second input signal In2 is at high level, the AND circuit 13 outputs low level; when the first input signal In1 is at high level and the second input signal In2 is at low level, the AND circuit 13 outputs a high level.

A fall of the output of the AND circuit 13 from high level to low level triggers the pulse generator 14 to generate a pulse with a narrower width than the output of the AND circuit 13 and feed the pulse to the primary side of the isolation transformer 3. A change in current resulting from the pulse fed to the primary side of the isolation transformer 3 causes a current to appear in the secondary side of the isolation transformer 3, and this current is fed to the logic circuit 21. In this case, the logic circuit 21 outputs a high-level signal, which is fed to the gate of the PMOS transistor 22 and to the gate of the NMOS transistor 23.

Here, the PMOS and NMOS transistors 22 and 23 are connected in series between a supply voltage Vcc2, which is applied to the VCC2 terminal, and a second ground potential GND2, which is applied to the GND2 terminal, to constitute a switching arm. Specifically, the source of the PMOS transistor 22 is connected to an application terminal for the supply voltage Vcc2. The drain of the PMOS transistor 22 is connected to the drain of the NMOS transistor 23 at a node N2. The source of the NMOS transistor 23 is connected to an application terminal for the second ground potential GND2.

The gate of the PMOS transistor 22 and the gate of the NMOS transistor 23 are connected to a node N1, which is connected to the output terminal of the logic circuit 21.

The node N2 is connected to the OUT terminal. To the OUT terminal, one terminal of a discharge resistor R20 is externally connected. The other terminal of the discharge resistor R20 is connected to the gate of the NMOS transistor Q. The source of the NMOS transistor Q is externally connected to the GND2 terminal. It should be noted that the second ground potential GND2, which serves as a reference potential in the secondary circuit 2, differs from the first ground potential GND1, which is applied to the GND1 terminal to serve as a reference potential in the primary circuit 1.

Here, with a high-level signal from the logic circuit 21 applied to the node N1 as mentioned above, the PMOS transistor 22 is off, the NMOS transistor 23 is on, and the voltage at the OUT terminal equals the second ground potential GND2 (low level). Thus the NMOS transistor Q is off.

By contrast, a rise of the output of the AND circuit 13 from low level to high level triggers the pulse generator 14 to generate a pulse with a narrower width than the output of the AND circuit 13 and feed the pulse to the primary side of the isolation transformer 3. A change in current resulting from the pulse fed to the primary side of the isolation transformer 3 causes a current to appear in the secondary side of the isolation transformer 3, and this current is fed to the logic circuit 21. In this case, the logic circuit 21 outputs a low level signal, which is applied to the node N1.

In this state, the PMOS transistor 22 is on, the NMOS transistor 23 is off, and the voltage at the OUT terminal equals the supply voltage Vcc2 (high level). Thus the NMOS transistor Q is on.

Any transistor that is the target of driving by the gate driver 10 may be configured as, instead of an NMOS transistor Q, an IGBT. In that case, to the gate of the IGBT the other terminal of the resistor R20 is connected, and to the emitter of the IGBT the GND2 terminal is connected.

The second UVLO circuit 26 monitors the supply voltage Vcc2, which is applied to the VCC2 terminal. When the supply voltage Vcc2 becomes lower than a predetermined voltage, the second UVLO circuit 26 shuts down the secondary circuit 2. The OVP circuit 27 detects an overvoltage in the supply voltage Vcc2.

The mirror clamp MOS transistor 24 is an NMOS transistor for a mirror clamp function whereby to suppress erroneous turning-on of the NMOS transistor Q due to a rise in the gate voltage of the NMOS transistor Q while it is in the off state.

Here, the high-side and low-side transistors QH and QL (FIG. 1) may experience this phenomenon: with one of the driving target transistors off, turning on the other causes the gate voltage of the first transistor to be elevated. For example, with the high-side transistor QH off, turning on the low-side transistor QL causes a current to pass to the low-side transistor QL via the gate-drain parasitic capacitance in the high-side transistor QH, the NMOS transistor 23 (FIG. 2) in the gate driver 10, and the line of the second ground potential GND2. At this time the parasitic inductance on the line of the second ground potential GND2 causes the gate voltage of the high-side transistor QH to be elevated. This elevation in the gate voltage may cause the high-side transistor QH to turn on erroneously. Erroneous turning-on with the low-side transistor QL off can be explained similarly. The mirror clamp MOS transistor 24 in the gate driver 10 is provided to suppress such erroneous turning-on of a driving target transistor.

The drain of the mirror clamp MOS transistor 24 is connected to the MC terminal. The gate of the NMOS transistor Q is externally connected to the MC terminal. The source of the mirror clamp MOS transistor 24 is connected to the GND2 terminal. The gate of the mirror clamp MOS transistor 24 is driven by the logic circuit 21.

The inverting input terminal (−) of the comparator 25 is connected to the MC terminal. The non-inverting input terminal (+) of the comparator 25 is connected to an application terminal for a reference voltage REF. Thus the comparator 25 compares the voltage at the MC terminal, that is, the gate voltage of the NMOS transistor Q, with the reference voltage REF, and feeds the comparison result to the logic circuit 21.

The operation for the mirror clamp function will be described. When the signal that the logic circuit 21 feeds to the node N1 turns from low level to high level, the voltage at the OUT terminal turns from high level to low level. Then electric charge is extracted from the gate of the NMOS transistor Q via the resistor R20; thus the gate voltage of the NMOS transistor Q starts to fall and the NMOS transistor Q is turned off. When the gate voltage of the NMOS transistor Q, that is the voltage at the MC terminal, becomes lower than the reference voltage REF, the output of the comparator 25 turns to high level. Thus the logic circuit 21 feeds a high-level signal to the gate of the mirror clamp MOS transistor 24 and turns on the mirror clamp MOS transistor 24. In this way, even if the gate voltage of the NMOS transistor Q in the off state tends to be elevated, electric charge is extracted from the gate of the NMOS transistor Q via the mirror clamp MOS transistor 24, and this suppresses the elevation in the gate voltage of the NMOS transistor Q. It is thus possible to suppress erroneous turning-on of the NMOS transistor Q.

Incidentally, when the logic circuit 21 turns the voltage at the OUT terminal from low level to high level and turns on the NMOS transistor Q, the logic circuit 21 turns off the mirror clamp MOS transistor 24.

Inconveniently, with the gate driving circuit 20 of the comparative example described above, due to the gate driver 10 incorporating the mirror clamp MOS transistor 24 being an IC package of a comparatively large size, a long conductor is required to connect between the MC terminal and the gate of the NMOS transistor Q. This results in a high impedance in the just-mentioned conductor, and may diminish, in the event that the gate voltage of the NMOS transistor Q in the off state tends to be elevated, the effect of the mirror clamp MOS transistor 24 suppressing the rise in the gate voltage.

Moreover, with the gate driving circuit 20 of the comparative example, there is a need to provide the gate driver 10 with a detection terminal (MC terminal) via which to detect the gate voltage of the NMOS transistor Q.

3. First Embodiment

A first embodiment of the present disclosure will now be described.
<3-1. Configuration of a Gate Driving Circuit>

Figure 3:
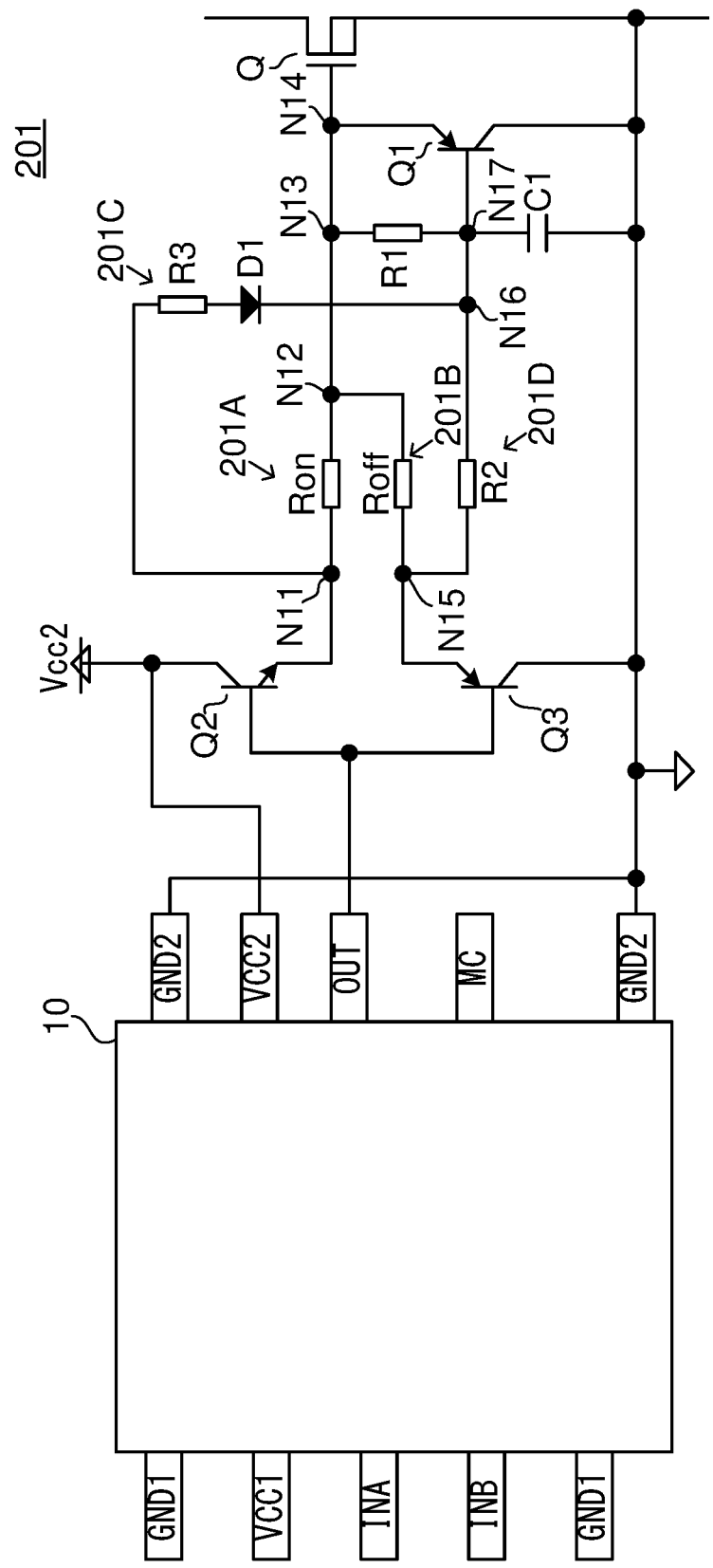
FIG. 3 a diagram showing a configuration of a gate driving circuit according to a first embodiment.

FIG. 3 is a diagram showing the configuration of a gate driving circuit 201 according to the first embodiment. The gate driving circuit 201 drives the gate of an NMOS transistor Q as a driving target transistor. As in the comparative example described previously, the NMOS transistor Q corresponds to either of the high-side and low-side transistors QH and QL shown in FIG. 1. Accordingly, the gate driving circuit 201 corresponds to either of the high-side and low-side gate driving circuits GH and GL.

As shown in FIG. 3, the gate driving circuit 201 includes a gate driver 10, a PNP transistor Q1, a high-side NPN transistor Q2, a low-side PNP transistor Q3, a base-emitter resistor R1, a discharge resistor R2, an on-resistor Ron, an off-resistor Roff, a charge resistor R3, and a reverse current prevention diode D1. The PNP transistor Q1, the high-side NPN transistor Q2, the low-side PNP transistor Q3, the base-emitter resistor R1, the discharge resistor R2, the on-resistor Ron, the off-resistor Roff, the charge resistor R3, and the reverse current prevention diode D1 are discrete component that are externally connected to the gate driver 10. The PNP and NPN transistors are bipolar transistors.

The gate driver 10 has a configuration similar to that in the comparative example described previously. The collector of the high-side NPN transistor Q2 is connected to the application terminal for the supply voltage Vcc2. The emitter of the high-side NPN transistor Q2 is connected to one terminal of the on-resistor Ron at a node N11. The other terminal of the on-resistor Ron is connected to the gate of the NMOS transistor Q.

The emitter of the low-side PNP transistor Q3 is connected to one terminal of the off-resistor Roff at a node N15. The other terminal of the off-resistor Roff is connected to the other terminal of the on-resistor Ron at a node N12. The collector of the low-side PNP transistor Q3 is connected to the GND2 terminal, that is, the application terminal for the second ground potential GND2. The base of the high-side NPN transistor Q2 and the base of the low-side PNP transistor Q3 are both connected to the OUT terminal.

The PNP transistor Q1 is provided for the mirror clamp function. The emitter of the PNP transistor Q1 is connected to the gate of the NMOS transistor Q at a node N14. The collector of the PNP transistor Q1 is connected to the application terminal for the second ground potential GND2.

The base of the PNP transistor Q1 is connected to one terminal of a capacitor C1 at a node N17. One terminal of the base-emitter resistor R1 is connected to a node N13. The other terminal of the base-emitter resistor R1 is connected to the node N17. One terminal of the discharge resistor R2 is connected to the node N17. The other terminal of the discharge resistor R2 is connected to a node N15.

One terminal of the charge resistor R3 is connected to the node N11. The other terminal of the charge resistor R3 is connected to the anode of the reverse current prevention diode D1. The cathode of the reverse current prevention diode D1 is connected to the node N17 at a node N16.

As shown in FIG. 3, the MC terminal of the gate driver 10 has nothing externally connected to it, and is left unused.

As described above, with the gate driving circuit 201 according to this embodiment, the circuit that is externally connected to the gate driver 10 can be built with resistors, a capacitor, bipolar transistors, and a diode. This helps achieve low cost and space saving. Moreover, the just-mentioned circuit has no complicated configuration. Furthermore, the use of a current-driven PNP transistor Q1 as the mirror clamp transistor leads to robustness against noise.
<3-2. Gate Driving Operation>

A description will now be given of the operation for driving the gate of the NMOS transistor Q by the gate driving circuit 201 configured as described above.

The gate driving circuit 201 includes, as its functional blocks, a charge supplier 201A, a charge extractor 201B, a charger 201C, and a discharger 201D.

The charge supplier 201A includes the high-side NPN transistor Q2 and the on-resistor Ron, and has the function of supplying electric charge to the gate of the NMOS transistor Q and thereby turning on the NMOS transistor Q.

The charge extractor 201B includes the low-side PNP transistor Q3 and the off-resistor Roff, and has the function of extracting electric charge from the gate of the NMOS transistor Q and thereby turning off the NMOS transistor Q.

The charger 201C includes the high-side NPN transistor Q2, the charge resistor R3, and the reverse current prevention diode D1, and has the function of charging the capacitor C1 when the charge supplier 201A supplies electric charge to the gate of the NMOS transistor Q.

The discharger 201D includes the low-side PNP transistor Q3 and the discharge resistor R2, and has the function of discharging the capacitor C1 when the charge extractor 201B extracts electric charge from the gate of the NMOS transistor Q.

First, the operation that takes place when the NMOS transistor Q is turned on will be described with reference to FIG. 4A. When the gate driver 10 turns the voltage at the OUT terminal from low level to high level, the high-side NPN transistor Q2 turns on and the low-side PNP transistor Q3 turns off. Thus, as indicated by a solid line in FIG. 4A, a current passes from the application terminal for the supply voltage Vcc2 via the high-side NPN transistor Q2 and the on-resistor Ron into the gate of the NMOS transistor Q. That is, the charge supplier 201A supplies electric charge to the gate of the NMOS transistor Q. Accordingly, the gate voltage of the NMOS transistor Q starts to rise, and the NMOS transistor Q is turned on.

Figure 4A:
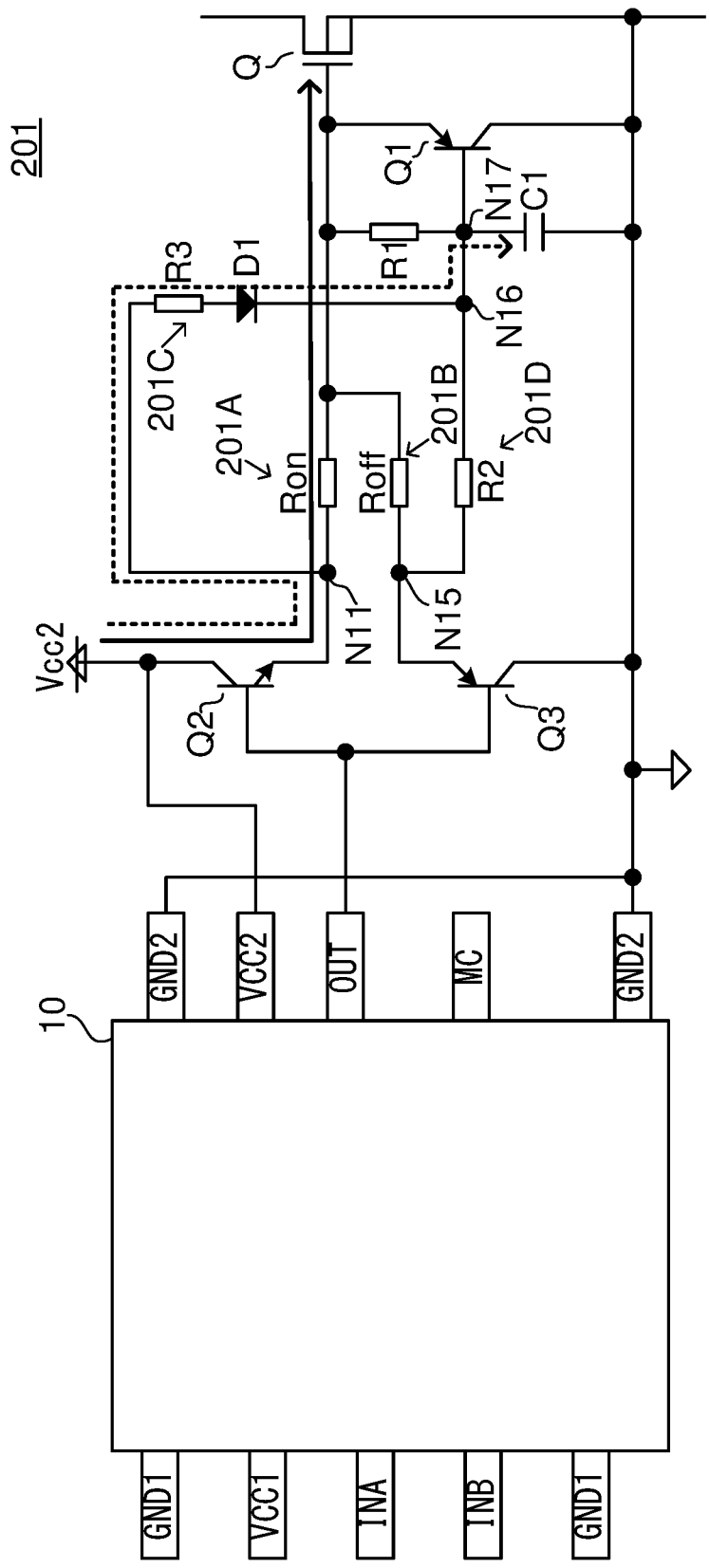
FIG. 4A is a diagram showing operation that takes place when an NMOS transistor is turned on in the first embodiment.

Meanwhile, as indicated by a broken line in FIG. 4A, a current passes from the application terminal for the supply voltage Vcc2 via the node N11, the charge resistor R3, and the reverse current prevention diode D1 into the capacitor C1. That is, the charger 201C charges the capacitor C1.

Here, the on-resistor Ron is given a resistance value higher than that of the charge resistor R3. For example, Ron is about three times R3. Thus the capacitor C1 is charged quickly, and the base voltage of the PNP transistor Q1 is raised quickly, turning off the PNP transistor Q1. In this way it is possible to prevent a through current from passing through the PNP transistor Q1 resulting from the PNP transistor Q1 turning on.

Next, the operation that takes place when the NMOS transistor Q is turned off will be described with reference to FIG. 4B. When the gate driver 10 turns the voltage at the OUT terminal from high level to low level, the high-side NPN transistor Q2 turns off and the low-side PNP transistor Q3 turns off. Thus, as indicated by a solid line in FIG. 4B, a current passes across the path from the gate of the NMOS transistor Q via the off-resistor Roff and the low-side PNP transistor Q3, and electric charge is extracted from the gate of the NMOS transistor Q. That is, the charge extractor 201B extracts electric charge from the gate of the NMOS transistor Q. Accordingly, the gate voltage of the NMOS transistor Q starts to fall, and the NMOS transistor Q is turned off.

Figure 4B:
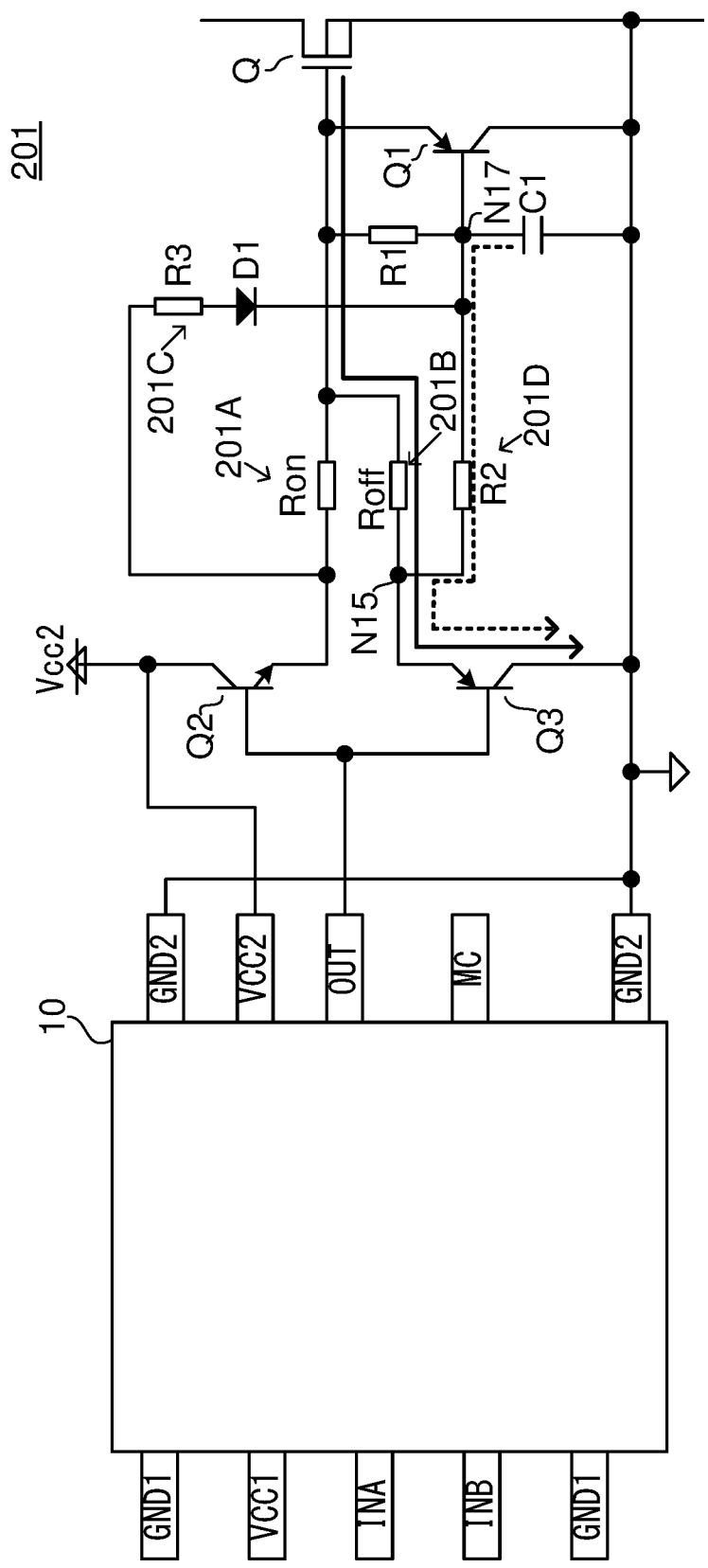
FIG. 4B is a diagram showing operation that takes place when an NMOS transistor is turned off in the first embodiment.

Meanwhile, as indicated by a broken line in FIG. 4B, a current passes across the path from the capacitor C1 via the discharge resistor R2 and the low-side PNP transistor Q3. That is, the discharger 201D discharges the capacitor C1. Here, by the delay circuit constituted by the discharge resistor R2 and the capacitor C1, the fall of the base voltage of the PNP transistor Q1 is delayed. Thus, until the gate voltage of the NMOS transistor Q falls sufficiently, the PNP transistor Q1 is prevented from being turned on, and this suppresses heat generation by the current passing through the PNP transistor Q1. Once the PNP transistor Q1 is turned on, the fall of the gate voltage of the NMOS transistor Q keeps the PNP transistor Q1 off. That is, with the NMOS transistor Q off, the PNP transistor Q1 is off.

The reverse current prevention diode D1 serves, when the capacitor C1 is discharged, to restrain electric charge from being supplied from the capacitor C1 via the node N16, the charge resistor R3, the node N11, and the on-resistor Ron to the gate of the NMOS transistor Q and inhibiting the turning-off of the NMOS transistor Q.

<3-3. Mirror Clamp Operation>

Next, the mirror clamp operation by the gate driving circuit 201 will be described. If with the NMOS transistor Q off an elevation occurs in the gate voltage of the NMOS transistor Q, this gate voltage is voltage-divided by the base-emitter resistor R1 and the discharge resistor R2 to produce a voltage across the base-emitter resistor R1. That is, the voltage appearing between the base and emitter of the PNP transistor Q1 causes a base current to pass from the emitter to the base of the PNP transistor Q1, and this turns the PNP transistor Q1 on. Thus electric charge is extracted from the gate of the NMOS transistor Q via the PNP transistor Q1, and this suppresses the elevation in the gate voltage of the NMOS transistor Q. In this way it is possible to suppress erroneous turning-on of the NMOS transistor Q.

As described above, in this embodiment, a PNP transistor Q1 is used as a mirror clamp transistor. For the PNP transistor Q1, a small-size IC package can be used, and thus the PNP transistor Q1 can be arranged as close as possible to the NMOS transistor Q. This shortens the length of the conductor connecting the PNP transistor Q1 to the gate of the NMOS transistor Q, and helps improve the effect of suppressing a rise in the gate voltage of the NMOS transistor Q. That is, it is possible to improve the effect of suppressing erroneous turning-on of the NNOS transistor Q.

Moreover, as shown in FIG. 3, the MC terminal of the gate driver 10 is left unused. Thus it is possible to use a gate drive that is not provided with a detection terminal via which to detect the gate voltage of the NMOS transistor Q.

<3-4. Operation Simulation>

Figure 5:
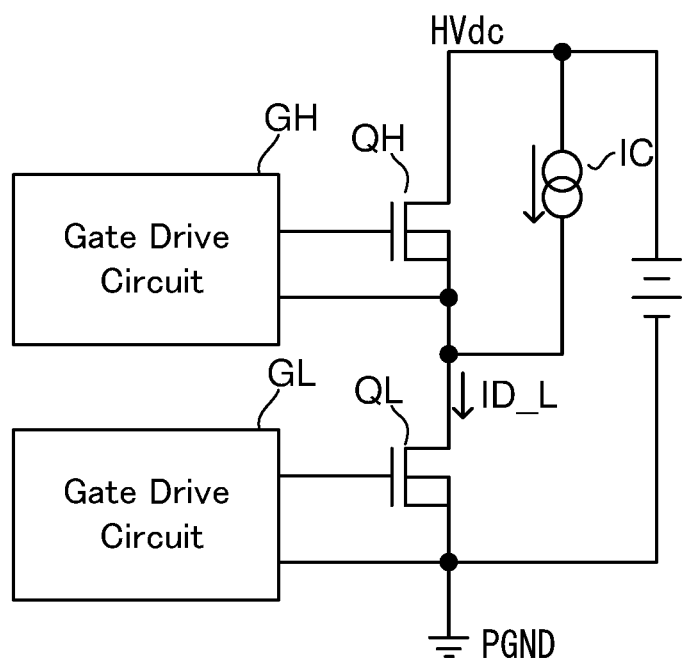
FIG. 5 is a diagram showing a configuration of a transistor driving system used in a simulation.

Now a description will be given of a simulation performed to verify the effectiveness of this embodiment. FIG. 5 is a diagram showing the configuration of the transistor driving system used in the simulation. The configuration shown in FIG. 5 results from, in the configuration shown in FIG. 1, a constant current source IC is arranged between the drain and source of the high-side transistor QH. The high-side gate driving circuit GH and the low-side gate driving circuit GL shown in FIG. 5 each include circuits similarly configured to those externally connected to the gate driver 10 shown in FIG. 3.

Figure 6A:
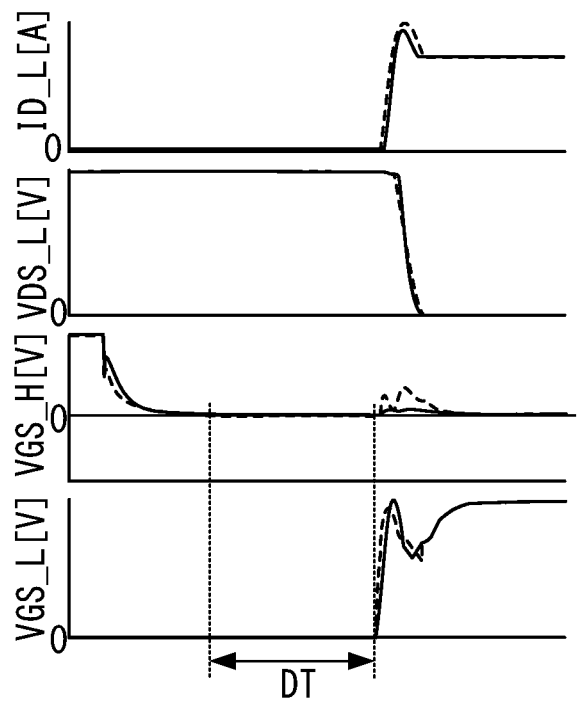
FIG. 6A is a diagram showing an example of signal waveforms observed in a simulation.
Figure 6B:
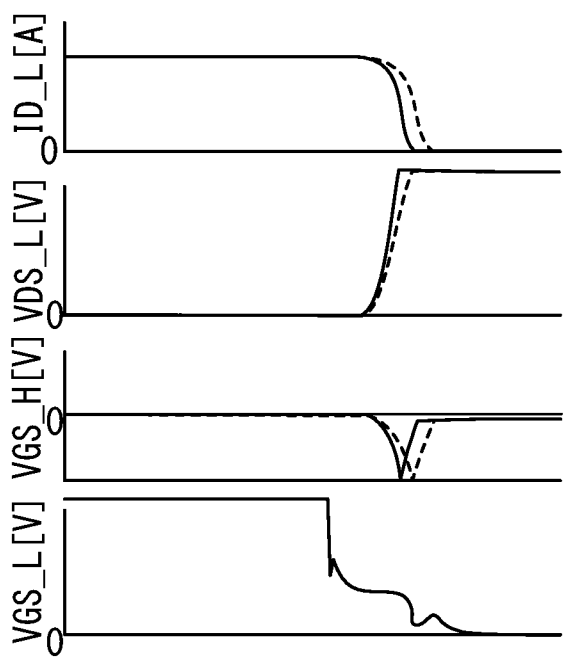
FIG. 6B is a diagram showing an example of signal waveforms observed in a simulation.

The signal waveforms observed in the simulation are shown in FIGS. 6A and 6B. FIGS. 6A and 6B each depict, from the top down, the drain current ID_L through the low-side transistor QL, the drain-source voltage VDS_L of the low-side transistor QL, the gate-source voltage VGS_H of the high-side transistor QH, and the gate-source voltage VGS_L of the low-side transistor QL. In FIGS. 6A and 6B, solid lines represent the results of the simulation with the circuit according to this embodiment (i.e., including the mirror clamp function) and broken lines represent the results of a simulation without the mirror clamp function.

In FIG. 6A, after a dead time DT in which the high-side and low-side transistors QH and QL are both off, the gate-source voltage VGS_L of the low-side transistor QL is raised so that the low-side transistor QL is turned on. At this time, as will be understood from comparison of the solid and broken lines representing the gate-source voltage VGS_H of the high-side transistor QH, this embodiment manages to suppress an elevation in the gate-source voltage VGS_H. That is, it will be understood that the mirror clamp function by the PNP transistor Q1 is effective. In this way, as shown in FIG. 6A, an elevation that occurs at the rise of the drain current ID_L passing through the low-side transistor QL is suppressed.

On the other hand, FIG. 6B shows how the charge extractor 201B extracts electric charge from the gate of the low-side transistor QL, the gate-source voltage VGS_L of the low-side transistor QL falls, and the low-side transistor QL is turned off. Meanwhile, the discharger 201D discharges the capacitor C1, and here it will be understood that, owing to the delay produced by the capacitor C1 and the discharge resistor R2, the PNP transistor Q1 is kept off and this suppresses short-circuiting of the gate-source voltage VGS_L with the ground potential PGND. In this way, heat generation in the PNP transistor Q1 is suppressed.

<3-5. Determining Circuit Constants>

A description will now be given of one example of how to determine circuit constants in the circuit configuration according to this embodiment shown in FIG. 3. The circuit constants are determined in the order C1, then R2, then R3, and then R1.

First, C1 is determined. For example, C1 is determined such that expression (1) below is fulfilled.

$$C1 < Cgs/10 \quad (1)$$

Here, Cgs is the gate-source parasitic capacitance of the NMOS transistor Q.

Next, for C1 and R2, which constitute the circuit that delays the turning-on of the PNP transistor Q1 at the turning-off of the NMOS transistor Q, R2 is determined such that expression (2) below is fulfilled.

$$Roff \times Cgs \leq R2 \times C1 \quad (2)$$

Next, for quick charging of the capacitor C1 and turning-off of the PNP transistor Q1 at the turning-on of the NMOS transistor Q, R3 is determined such that expression (3) below is fulfilled.

$$Ron \times Cgs > R3 \times C1 \quad (3)$$

Next, to secure a sufficient base-emitter voltage of the PNP transistor Q1 to turn it on in case the gate voltage of the NMOS transistor Q in the off state tends to be elevated, R1 is determined such that expression (4) is fulfilled.

$$R1 > 100 \times R2 \quad (4)$$

4. Second Embodiment

Figure 7:
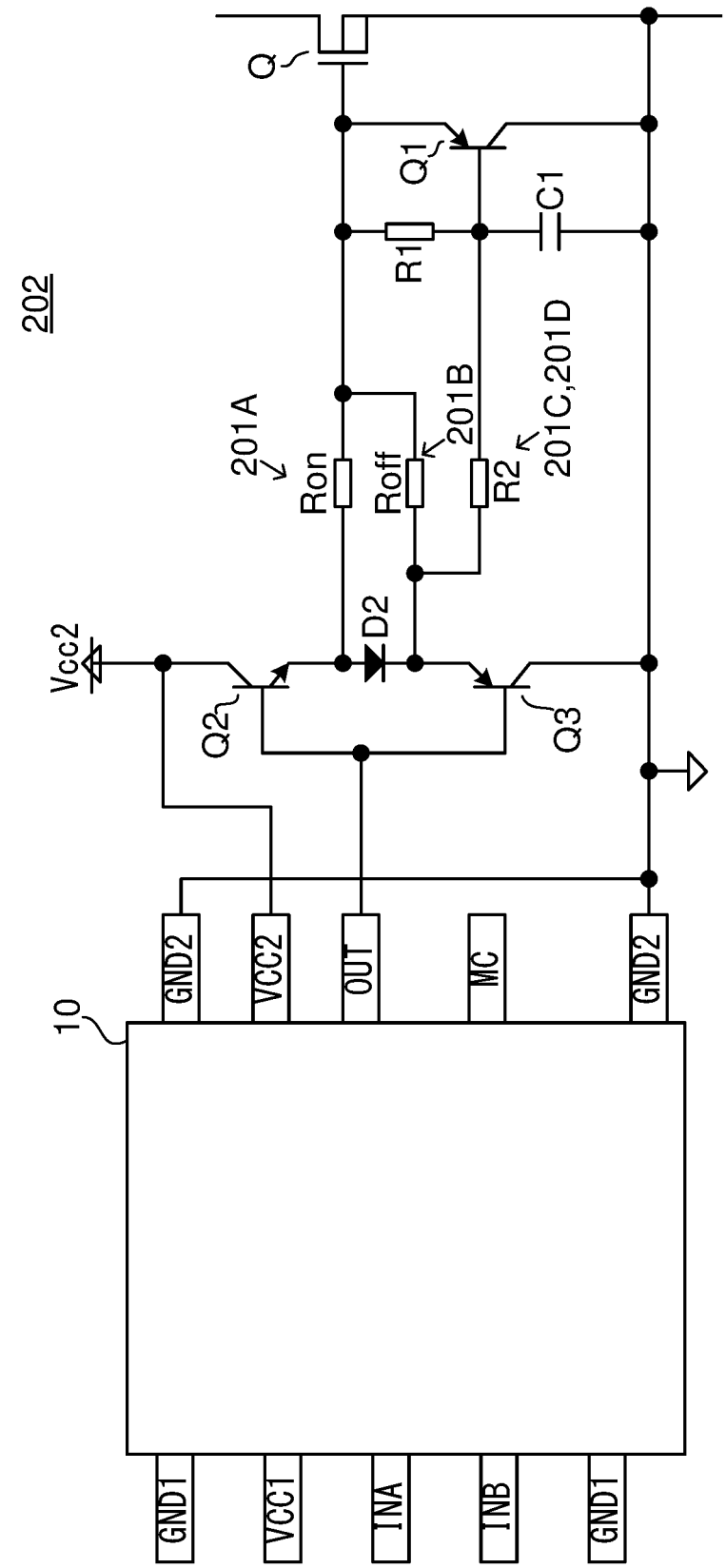
FIG. 7 a diagram showing a configuration of a gate driving circuit according to a second embodiment.

Next, a second embodiment of the present disclosure will be described. FIG. 7 is a diagram showing the configuration of a gate driving circuit 202 according to the second embodiment. The gate driving circuit 202 shown in FIG. 7 differs in configuration from that of the first embodiment (FIG. 3) in that, instead of the charge resistor R3 and the reverse current prevention diode D1, an emitter-connected diode D2 is provided.

Specifically, the anode of the emitter-connected diode D2 is connected to the emitter of the high-side NPN transistor Q2. The cathode of the emitter-connected diode D2 is connected to the emitter of the low-side PNP transistor Q3. In the gate driving circuit 202 configured in this way, unlike in the first embodiment, the charger 201C includes the high-side NPN transistor Q2, the emitter-connected diode D2, and the charge/discharge resistor R2. The emitter-connected diode D2 also functions as a reverse current prevention diode.

Now, with reference to FIG. 8, a description will be given of the operation that takes place when the NMOS transistor Q is turned on in the gate driving circuit 202. When the voltage at the OUT terminal turns from low level to high level, the high-side NPN transistor Q2 turns on and the low-side PNP transistor Q3 turns off. Thus, as in the first embodiment, as indicated by a solid line in FIG. 8, the charge supplier 201A supplies electric charge to the gate of the NMOS transistor Q.

Figure 8:
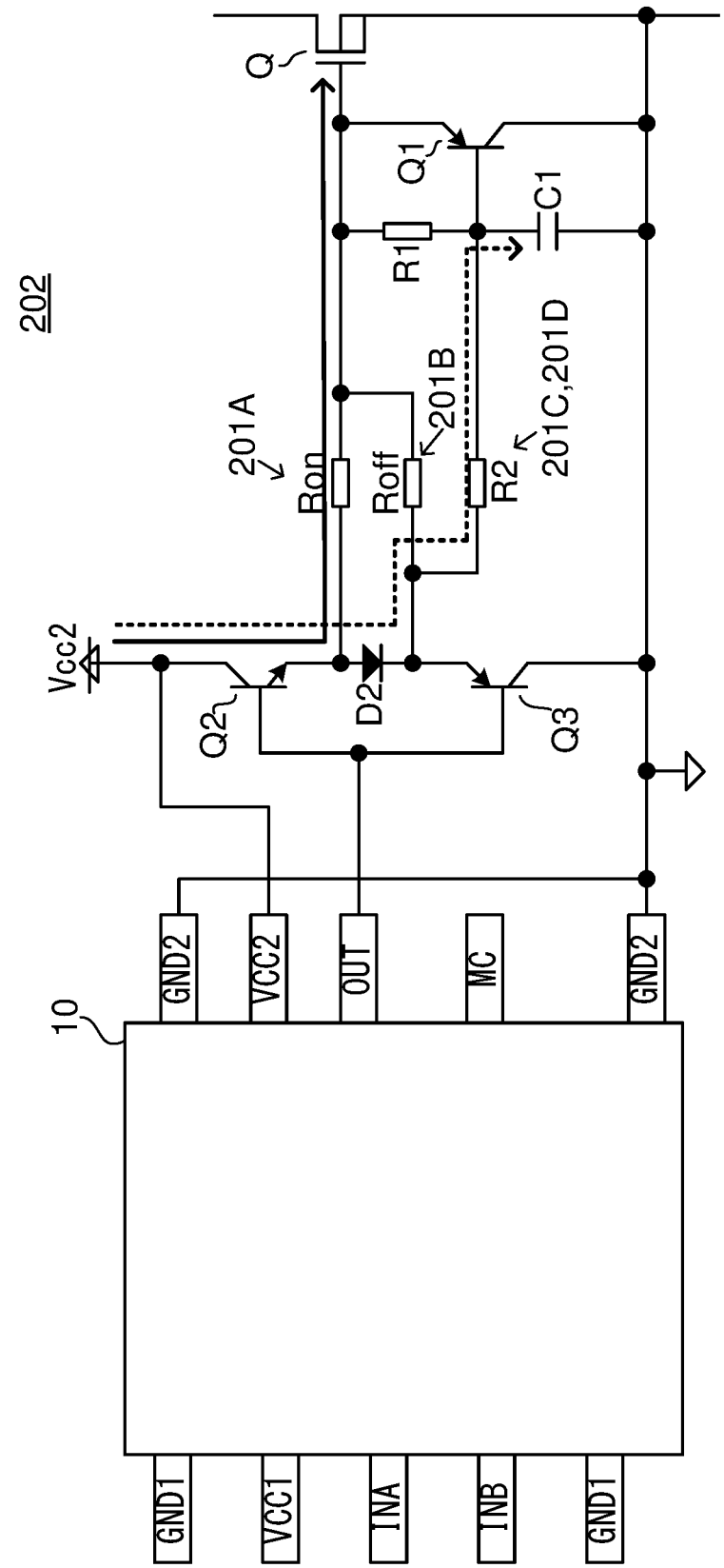
FIG. 8 is a diagram showing operation that takes place when an NMOS transistor is turned on in the second embodiment.

In this state, as indicated by a broken line in FIG. 8, a current passes from the application terminal for the supply voltage Vcc2 via the high-side NPN transistor Q2, the emitter-connected diode D2, and the charge/discharge resistor R2 into the capacitor C1. That is, the charger 201C incudes the high-side NPN transistor Q2, the emitter-connected diode D2, and the charge/discharge resistor R2; the charger 201C charges the capacitor C1.

On the other hand, when the NMOS transistor Q is turned off, as in the first embodiment, the capacitor C1 is discharged by the discharger 201D. Thus, in the second embodiment, the capacitor C1 is both charged and discharged via the same charge/discharge resistor R2. Thus, the first embodiment, where different resistors R3 and R2 are used for charging and discharging, allows easier designing of the resistance values. On the other hand, the second embodiment, where the charge resistor R3 and the reverse current prevention diode D1 can be replaced with the emitter-connected diode D2, helps reduce the number of components.

5. Third Embodiment

Figure 9:
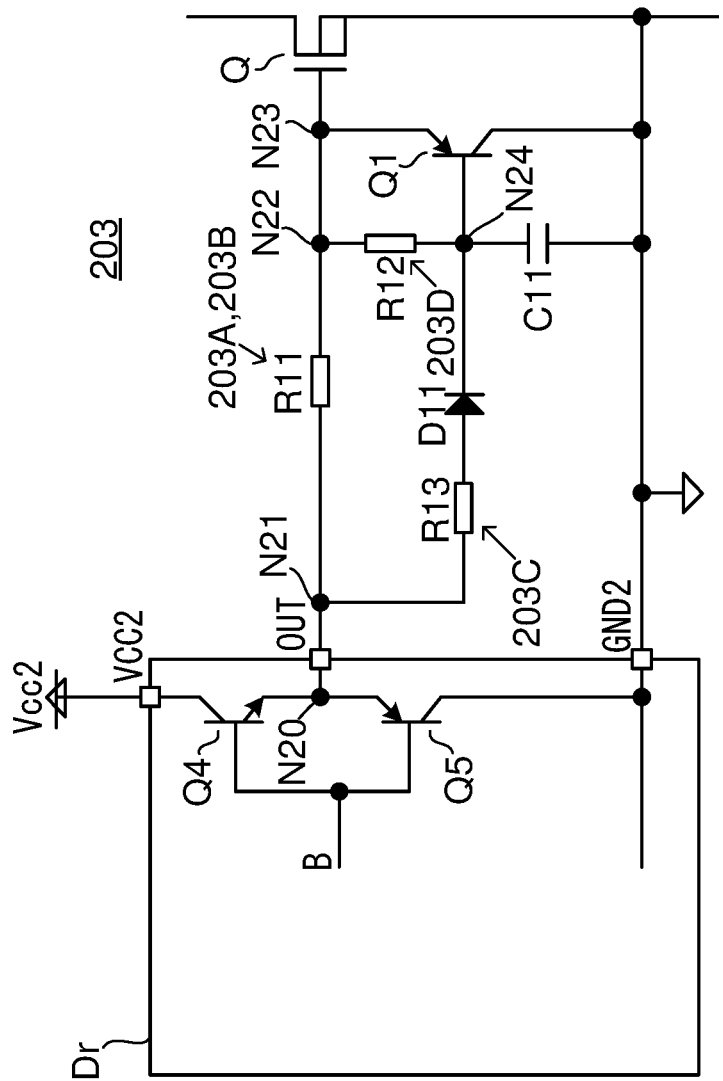
FIG. 9 is a diagram showing a configuration of a gate driving circuit according to a third embodiment.

Next, a third embodiment of the present disclosure will be described. FIG. 9 is a diagram showing the configuration of a gate driving circuit 203 according to the third embodiment.

The gate driving circuit 203 shown in FIG. 9 includes a gate driver Dr, an on/off-resistor R11, a base-emitter resistor R12, a charge resistor R13, a reverse current prevention diode D11, a capacitor C11, and a PNP transistor Q1. The gate driver Dr is an IC package, and includes a high-side NPN transistor Q4 and a low-side PNP transistor Q5. The gate driver Dr has, as external terminals, a VCC2 terminal, an OUT terminal, and a GND2 terminal. The resistors R11 to R13, the reverse current prevention diode D11, the capacitor C11, and the PNP transistor Q1 are discrete components that are externally connected to the gate driver Dr.

The collector of the high-side NPN transistor Q4 is connected to the VCC2 terminal. The VCC2 terminal is connected to the application terminal for the supply voltage Vcc2. The emitter of the high-side NPN transistor Q4 is connected to the emitter of the low-side PNP transistor Q5 at a node N20. The collector of the low-side PNP transistor Q5 is connected to the GND2 terminal.

The base-emitter resistor R12, the capacitor C11, and the PNP transistor Q1 shown in FIG. 9 correspond respectively to the base-emitter resistor R1, the capacitor C1, and the PNP transistor Q1 shown in FIG. 3.

The node N20 is connected to the OUT terminal. The OUT terminal is connected to one terminal of the on/off-resistor R11 at a node N21. The other terminal of the on/off-resistor R11 is connected to one terminal of the base-emitter resistor R12 at a node N22, and is also connected to the emitter of the PNP transistor Q1 at a node N23.

One terminal of the charge resistor R13 is connected to the node N21. The other terminal of the charge resistor R13 is connected to the anode of the reverse current prevention diode D11. The cathode of the reverse current prevention diode D11 is connected to a node N24 to which the other terminal of the base-emitter resistor R12 and one terminal of the capacitor C11 are connected.

Next, the operation of the gate driving circuit 203 configured as described above will be described with reference to FIGS. 10A and 10B. Here, the gate driving circuit 203 includes a charge supplier 203A, a charge extractor 203B, a charger 203C, and a discharger 203D.

The charge supplier 203A includes the high-side NPN transistor Q4 and the on/off-resistor R11. The charge extractor 203B includes the low-side PNP transistor Q5 and the on/off-resistor R11. The charger 203C includes the high-side NPN transistor Q4, the charge resistor R13, and the reverse current prevention diode D11. The discharger 203D includes the base-emitter resistor R12, the on/off-resistor R11, and the low-side PNP transistor Q5.

In the gate driver Dr, when the base signal B that is applied to the respective bases of the high-side NPN transistor Q4 and the low-side PNP transistor Q5 is turned from low level to high level, the high-side NPN transistor Q4 turns on and the low-side PNP transistor Q5 turns off. Thus, as indicated by a solid line in FIG. 10A, a current passes from the application terminal for the supply voltage Vcc2 via the high-side NPN transistor Q4 and the on/off-resistor R11 into the gate of the NMOS transistor Q. That is, the charge supplier 203A supplies electric charge to the gate of the NMOS transistor Q. Thus, the NMOS transistor Q is turned on.

Figure 10A:
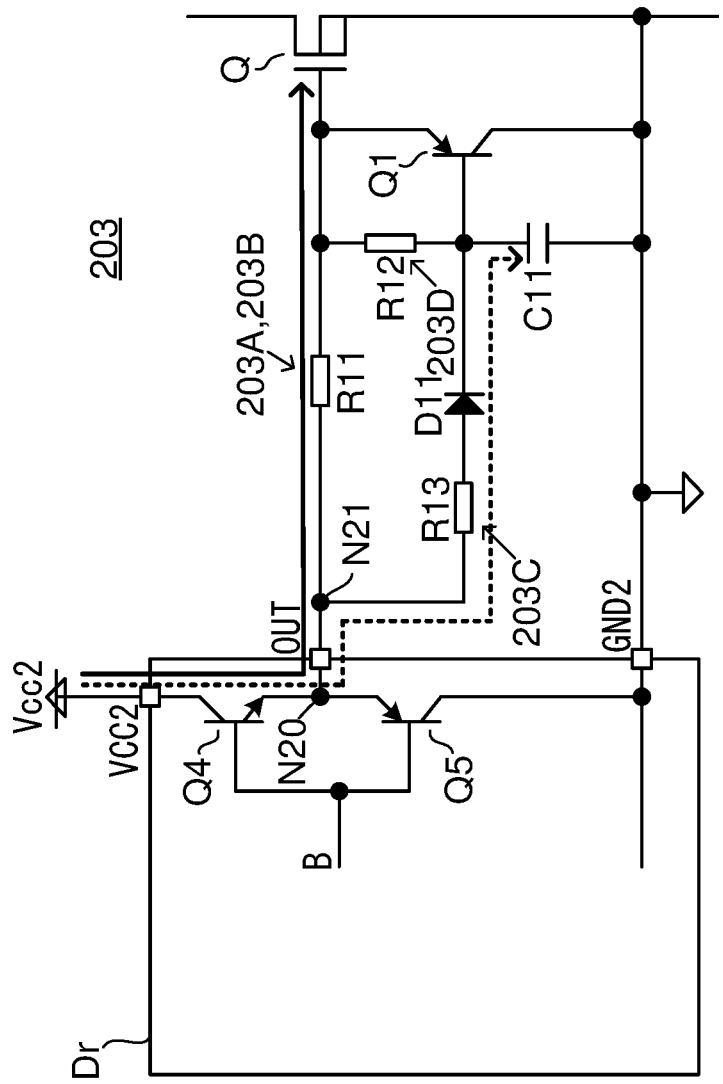
FIG. 10A is a diagram showing operation that takes place when an NMOS transistor is turned on in the third embodiment.

Meanwhile, as indicated by a broken line in FIG. 10A, electric charge is supplied from the application terminal for the supply voltage Vcc2 via the high-side NPN transistor Q4, the charge resistor R13, and the reverse current prevention diode D11 to the capacitor C11. That is, the charger 203C charges the capacitor C11.

On the other hand, when the base signal B is turned from high level to low level, the high-side NPN transistor Q4 turns off and the low-side PNP transistor Q5 turns on. Thus, as indicated by a solid line in FIG. 10B, electric charge is extracted from the gate of the NMOS transistor Q via the on/off-resistor R11 and the low-side PNP transistor Q5. That is, the charge extractor 203B extracts electric charge from the gate of the NMOS transistor Q. Thus, the NMOS transistor Q is turned off.

Figure 10B:
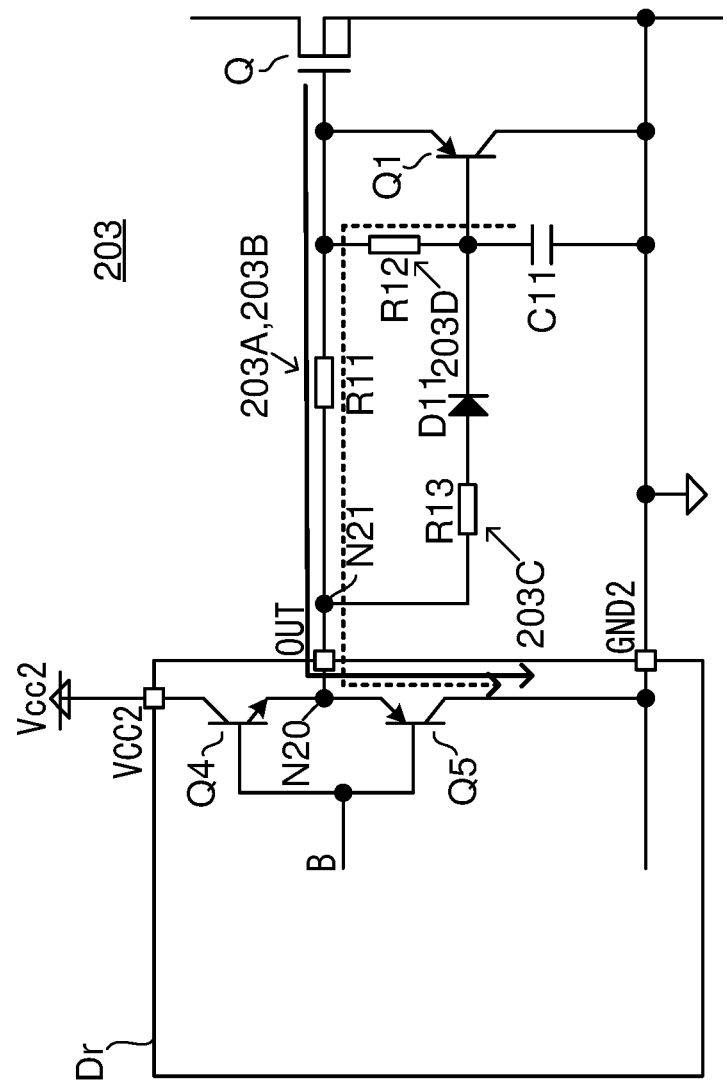
FIG. 10B is a diagram showing operation that takes place when an NMOS transistor is turned off in the third embodiment.

Meanwhile, as indicated by a broken line in FIG. 10B, electric charge is extracted from the capacitor C11 via the base-emitter resistor R12, the on/off-resistor R11, and the low-side PNP transistor Q5. That is, the discharger 203D discharges the capacitor C1, and the resistance of the base-emitter resistor R12 and the on/off-resistor R11 added up functions as a discharge resistor.

As described above, the third embodiment permits the use of the gate driver Dr that includes the high-side NPN transistor Q4 and the low-side PNP transistor Q5 of which the emitters are connected together at the node N20. It should however be noted that, in the third embodiment, both when the NMOS transistor Q is turned on and when it is turned off, a current passes across a path through the on/off-resistor R11. By contrast, in the first and second embodiments (FIGS. 3 and 7), owing to the use of the high-side NPN transistor Q2 and the low-side PNP transistor Q3 of which the emitters are not connected together, a current passes across a path through the on-resistor Ron when the NMOS transistor Q is turned on and across a path through the off-resistor Roff when the NMOS transistor Q is turned off. Thus the first and second embodiments permit easier designing of the resistance values.

6. Notes

As described above, according to one aspect of the present disclosure, a gate driving circuit (201) includes:
- a PNP transistor (Q1) having an emitter connected to a gate of a driving target transistor (Q) and a collector connected to an application terminal for a ground potential;
- a capacitor (C1) having a first terminal connected to a base of the PNP transistor and a second terminal connected to the application terminal for the ground potential;
- a base-emitter resistor (R1) having a first terminal connected to the emitter of the PNP transistor and a second terminal connected to the base of the PNP transistor;
- a charge supplier (201A) configured to be capable of supplying electric charge to the gate of the driving target transistor;
- a charge extractor (201B) configured to be capable of extracting electric charge from the gate of the driving target transistor;
- a charger (201C) configured to be capable of charging the capacitor when the charge supplier supplies electric charge to the gate of the driving target transistor; and
- a discharger (201D) configured to be capable of discharging the capacitor when the charge extractor extracts electric charge from the gate of the driving target transistor.

(A First Configuration.)

In the first configuration described above, the charge supplier (201A) may include an on-resistor (Ron) in a path across which the charge supplier supplies electric charge, the charger (201C) may include a charge resistor (R3) in a path across which the charger charges the capacitor, and the charge resistor may have a resistance value lower than a resistance value of the on-resistor. (A second configuration.)

In the second configuration described above, the charge resistor (R3) may have a resistance value R3 that fulfills the following expression:

$$Ron \times Cgs > R3 \times C1$$

where

Ron represents the resistance value of the on-resistor;

C1 represents the capacitance value of the capacitor; and

Cgs represents the capacitance value of a gate-source parasitic capacitance of the driving target transistor. (A third configuration.)

In the second or third configuration described above, the charger (201C) may include a reverse current prevention diode (D1) in the path across which the charger charges the capacitor. (A fourth configuration.)

In any of the first to fourth configurations described above, the discharger (201D) may include a discharge resistor (R2) in a path across which the discharger discharges the capacitor. (A fifth configuration.)

In the fifth configuration described above, the charge extractor (201B) may include an off-resistor (Roff) in a path across which the charge extractor extracts electric charge, and the discharge resistor may have a resistance value R2 that fulfills the following expression:

$$Roff \times Cgs \leq R2 \times C1$$

where

Roff represents the resistance value of the off-resistor;
C1 represents the capacitance value of the capacitor; and
Cgs represents the capacitance value of a gate-source parasitic capacitance of the driving target transistor. (A sixth configuration.)

In the fifth or sixth configuration described above, the base-emitter resistor (R1) may have a resistance value R1 that fulfills the following expression:

$$R1 > 100 \times R2$$

where
R2 represents a resistance value of the discharge resistor. (A seventh configuration.)

In any of the first to seventh configurations described above, the capacitor (C1) may have a capacitance value C1 that fulfills the following expression:

$$C1 < Cgs/10$$

where
Cgs represents the capacitance value of a gate-source parasitic capacitance of the driving target transistor. (An eighth configuration.)

In any of the first to eighth configurations described above, there may be further provided:
a high-side NPN transistor (Q2) having a collector connected to an application terminal for a supply voltage (Vcc2);
an on-resistor (Ron) having a first terminal connected to an emitter of the high-side NPN transistor and a second terminal connected to the gate of the driving target transistor;
a low-side PNP transistor (Q3) having a collector connected to the application terminal for the ground potential; and
an off-resistor (Roff) having a first terminal connected to an emitter of the low-side PNP transistor and a second terminal connected to the gate of the driving target transistor. Here, the on-resistor and the off-resistor are separate from each other. (A ninth configuration.)

In the ninth configuration described above, the charger (201C) may include a charge resistor (R3) having a first terminal connected to a first node (N11) to which the emitter of the high-side NPN transistor (Q2) and the first terminal of the on-resistor are connected and a second terminal connected to the first terminal of the capacitor (C1), and the discharger (201D) may include a discharge resistor (R2) having a first terminal connected to a second node (N15) to which the emitter of the low-side PNP transistor (Q3) and the first terminal of the off-resistor (Roff) are connected and a second terminal connected to the first terminal of the capacitor. (A tenth configuration.)

In the tenth configuration described above, the charger (201C) may include a reverse current prevention diode (D1) between the first node (N11) and the first terminal of the capacitor (C1). (An eleventh configuration.)

In the ninth configuration described above, there may be further provided:
an emitter-connected diode (D2) having an anode connected to the emitter of the high-side NPN transistor (Q2) and a cathode connected to the emitter of the low-side PNP transistor (Q3); and
a charge/discharge resistor (R2) having a first terminal connected to a third node to which the emitter of the low-side PNP transistor (Q3) and the first terminal of the off-resistor (Roff) are connected and a second terminal connected to the first terminal of the capacitor (C1). (A twelfth configuration.)

In any of the first to eighth configurations described above, there may be further provided:
a high-side NPN transistor (Q4) having a collector connected to an application terminal for a supply voltage (Vcc2);
a low-side PNP transistor (Q5) having a collector connected to the application terminal for the ground potential; and
an on/off-resistor (R11) having a first terminal connected to a fourth node (N20) to which an emitter of the high-side NPN transistor and an emitter of the low-side PNP transistor are connected and a second terminal connected to the gate of the driving target transistor (Q). Here, the charger (203C) includes a charge resistor (R13) having a first terminal connected to a fifth node (N21) to which the fourth node and the first terminal of the on/off-resistor are connected and a second terminal connected to the first terminal of the capacitor (C11), and the discharger (203D) includes the base-emitter resistor (R12) and the on/off-resistor. (A thirteenth configuration.)

In the thirteenth configuration described above, the charger (203C) may include a reverse current prevention diode (D11) between the fifth node (N21) and the first terminal of the capacitor (C11). (A fourteenth configuration.)

In any of the first to fourteenth configurations described above, there may be further provided a gate driver (10) configured to be capable of driving the charge supplier (201A), the charge extractor (201B), the charger (201C), and the discharger (201D). (A fifteenth configuration.)

In the fifteenth configuration described above, the gate driver (10) may have no detection terminal via which to detect the gate voltage of the driving target transistor (Q). (A sixteenth configuration.)

according to another aspect of the present disclosure, a transistor driving system (100) includes:
a high-side transistor (QH) and a low-side transistor (QL) each as a driving target transistor; and
the gate driving circuits (201) according to any of the first to sixteenth configurations described above as separate circuits configured to be capable of driving the gates of the high-side and low-side transistors respectively.

INDUSTRIAL APPLICABILITY

What is disclosed herein finds application in the driving of the gate of MOS transistors and the like.

REFERENCE SIGNS LIST 1 primary circuit
2 secondary circuit
3 isolation transformer
10 gate driver
11 first Schmitt trigger
12 second Schmitt trigger
13 AND circuit
14 pulse generator
15 first UVLO circuit
20 gate driving circuit
21 logic circuit
22 PMOS transistor
23 NMOS transistor
24 mirror clamp MOS transistor
25 comparator
26 second UVLO circuit
27 OVP circuit 100 transistor driving system
201 to 203 gate driving circuit
201A charge supplier
201B charge extractor
201C charger
201D discharger
203A charge supplier
203B charge extractor
203C charger
203D discharger
C1 capacitor
C11 capacitor
C20 capacitor
D1 reverse current prevention diode
D11 reverse current prevention diode
D2 emitter-connected diode
Dr gate driver
GH high-side gate driving circuit
GL low-side gate driving circuit
IC constant current source
Q NMOS transistor
Q1 PNP transistor
Q2 high-side NPN transistor
Q3 low-side PNP transistor
Q4 high-side NPN transistor
Q5 low-side PNP transistor
QH high-side transistor
QL low-side transistor
R1 base-emitter resistor
R11 on/off-resistor
R12 base-emitter resistor
R13 charge resistor
R2 discharge resistor
R20 resistor
R3 charge resistor
Roff off-resistor
Ron on-resistor

The invention claimed is:
1. A gate driving circuit comprising:
a PNP transistor having
   an emitter connected to a gate of a driving target transistor and
   a collector connected to an application terminal for a ground potential;
a capacitor having
   a first terminal connected to a base of the PNP transistor and
   a second terminal connected to the application terminal for the ground potential;
a base-emitter resistor having
   a first terminal connected to the emitter of the PNP transistor and
   a second terminal connected to the base of the PNP transistor;
a charge supplier configured to be capable of supplying electric charge to the gate of the driving target transistor;
a charge extractor configured to be capable of extracting electric charge from the gate of the driving target transistor;
a charger configured to be capable of charging the capacitor when the charge supplier supplies electric charge to the gate of the driving target transistor;
a discharger configured to be capable of discharging the capacitor when the charge extractor extracts electric charge from the gate of the driving target transistor;
a high-side NPN transistor having a collector connected to an application terminal for a supply voltage;
an on-resistor having
   a first terminal connected to an emitter of the high-side NPN transistor and
   a second terminal connected to the gate of the driving target transistor;
a low-side PNP transistor having a collector connected to the application terminal for the ground potential;
an off-resistor having
   a first terminal connected to an emitter of the low-side PNP transistor and
   a second terminal connected to the gate of the driving target transistor,
wherein the on-resistor and the off-resistor are separate from each other;
an emitter-connected diode having
   an anode connected to the emitter of the high-side NPN transistor and
   a cathode connected to the emitter of the low-side PNP transistor; and
a charge/discharge resistor having
   a first terminal connected to a third node to which the emitter of the low-side PNP transistor and the first terminal of the off-resistor are connected and
   a second terminal connected to the first terminal of the capacitor.

2. The gate driving circuit according to claim 1, wherein
the charge supplier includes an on-resistor in a path across which the charge supplier supplies electric charge,
the charger includes a charge resistor in a path across which the charger charges the capacitor, and
the charge resistor has a resistance value lower than a resistance value of the on-resistor.

3. The gate driving circuit according to claim 2, wherein the charge resistor has a resistance value R3 that fulfills the following expression:

$$Ron \times Cgs > R3 \times C1$$

where
Ron represents the resistance value of the on-resistor;
C1 represents a capacitance value of the capacitor; and
Cgs represents a capacitance value of a gate-source parasitic capacitance of the driving target transistor.

4. The gate driving circuit according to claim 2, wherein the charger includes a reverse current prevention diode in the path across which the charger charges the capacitor.

5. The gate driving circuit according to claim 1, wherein the discharger includes a discharge resistor in a path across which the discharger discharges the capacitor.

6. The gate driving circuit according to claim 5, wherein
the charge extractor includes an off-resistor in a path across which the charge extractor extracts electric charge, and
the discharge resistor has a resistance value R2 that fulfills the following expression:

$$Roff \times Cgs \leq R2 \times C1$$

where
Roff represents the resistance value of the off-resistor;
C1 represents a capacitance value of the capacitor; and
Cgs represents a capacitance value of a gate-source parasitic capacitance of the driving target transistor.

7. The gate driving circuit according to claim 5, wherein
The base-emitter resistor has a resistance value R1 that fulfills the following expression:

$$R1 > 100 \times R2$$

where
R2 represents a resistance value of the discharge resistor.

8. The gate driving circuit according to claim 1, wherein the capacitor has a capacitance value C1 that fulfills the following expression:

$$C1 < Cgs/10$$

where
Cgs represents a capacitance value of a gate-source parasitic capacitance of the driving target transistor.

9. The gate driving circuit according to claim 1, wherein the charger includes a charge resistor having
   a first terminal connected to a first node to which the emitter of the high-side NPN transistor and the first terminal of the on-resistor are connected and
   a second terminal connected to the first terminal of the capacitor, and the discharger includes a discharge resistor having
   a first terminal connected to a second node to which the emitter of the low-side PNP transistor and the first terminal of the off-resistor are connected and
   a second terminal connected to the first terminal of the capacitor.

10. The gate driving circuit according to claim 9, wherein the charger includes a reverse current prevention diode between the first node and the first terminal of the capacitor.

11. The gate driving circuit according to claim 1, further comprising a gate driver configured to be capable of driving the charge supplier, the charge extractor, the charger, and the discharger.

12. The gate driving circuit according to claim 11, wherein
   the gate driver has no detection terminal via which to detect a gate voltage of the driving target transistor.

13. A transistor driving system comprising:
   a high-side transistor and a low-side transistor each as a driving target transistor; and
   a plurality of gate driving circuits according to claim 1, each gate driving circuit provided as a separate circuit and configured to be capable of driving gates of the high-side and low-side transistors, respectively.

14. A gate driving circuit comprising:
   a PNP transistor having
      an emitter connected to a gate of a driving target transistor and
      a collector connected to an application terminal for a ground potential;
   a capacitor having
      a first terminal connected to a base of the PNP transistor and
      a second terminal connected to the application terminal for the ground potential;
   a base-emitter resistor having
      a first terminal connected to the emitter of the PNP transistor and
      a second terminal connected to the base of the PNP transistor;
   a charge supplier configured to be capable of supplying electric charge to the gate of the driving target transistor;
   a charge extractor configured to be capable of extracting electric charge from the gate of the driving target transistor;
   a charger configured to be capable of charging the capacitor when the charge supplier supplies electric charge to the gate of the driving target transistor;
   a discharger configured to be capable of discharging the capacitor when the charge extractor extracts electric charge from the gate of the driving target transistor;
   a high-side NPN transistor having a collector connected to an application terminal for a supply voltage;
   a low-side PNP transistor having a collector connected to the application terminal for the ground potential; and
   an on/off-resistor having
      a first terminal connected to a fourth node to which an emitter of the high-side NPN transistor and an emitter of the low-side PNP transistor are connected and
      a second terminal connected to the gate of the driving target transistor,
   wherein
   the charger includes a charge resistor having
      a first terminal connected to a fifth node to which the fourth node and the first terminal of the on/off-resistor are connected and
      a second terminal connected to the first terminal of the capacitor, and the discharger includes the base-emitter resistor and the on/off-resistor.

15. The gate driving circuit according to claim 14, wherein
   the charger includes a reverse current prevention diode between the fifth node and the first terminal of the capacitor.

* * * * *